(12) United States Patent
Lee et al.

(10) Patent No.: US 12,038,518 B2
(45) Date of Patent: Jul. 16, 2024

(54) ELECTRONIC DEVICE

(71) Applicant: GETAC HOLDINGS CORPORATION, Taoyuan (TW)

(72) Inventors: Kun-Cheng Lee, Taipei (TW); Juei-Chi Chang, Taipei (TW); Min-Yu Wang, Taipei (TW)

(73) Assignee: GETAC HOLDINGS CORPORATION, Taoyuan (TW)

( * ) Notice: Subject to any disclaimer, the term of this patent is extended or adjusted under 35 U.S.C. 154(b) by 219 days.

(21) Appl. No.: 17/357,551

(22) Filed: Jun. 24, 2021

(65) Prior Publication Data

US 2021/0405144 A1 Dec. 30, 2021

Related U.S. Application Data

(60) Provisional application No. 63/044,206, filed on Jun. 25, 2020.

(30) Foreign Application Priority Data

Nov. 18, 2020 (CN) .......................... 202011294402.9

(51) Int. Cl.
| | |
|---|---|
| *G01S 3/38* | (2006.01) |
| *G01S 3/04* | (2006.01) |
| *H05K 5/00* | (2006.01) |
| *H05K 5/06* | (2006.01) |

(52) U.S. Cl.
CPC ................ *G01S 3/38* (2013.01); *G01S 3/043* (2013.01); *H05K 5/0004* (2013.01); *H05K 5/06* (2013.01)

(58) Field of Classification Search
CPC ........... G01S 3/38; G01S 3/43; H05K 5/0004; H05K 5/06
USPC ............................. 340/5.2; 342/371, 175, 59
See application file for complete search history.

(56) References Cited

U.S. PATENT DOCUMENTS

| | | | |
|---|---|---|---|
| 8,907,760 B2 * | 12/2014 | Nowottnick | H01Q 5/35 340/5.2 |
| 2012/0007718 A1 * | 1/2012 | Lee | H01Q 1/2216 340/10.4 |
| 2016/0146932 A1 * | 5/2016 | Millar | G01S 7/352 342/175 |
| 2016/0187479 A1 * | 6/2016 | Shibata | G01S 13/325 342/59 |

(Continued)

FOREIGN PATENT DOCUMENTS

CN         108232470 A     6/2018

*Primary Examiner* — Bo Fan
(74) *Attorney, Agent, or Firm* — Cooper Legal Group, LLC

(57) ABSTRACT

An electronic device provided by an embodiment of the present invention includes a body, a first, a second and a third array antennas. The body includes a first shell, which has a first and a second sides opposite to each other. The first array antenna is arranged in the first shell and adjacent to the first side, and has a first beam facing a first axis. The second array antenna is arranged in the first shell and adjacent to the second side, and has a second beam facing a second axis. The third array antenna is arranged in the first shell and located between the first and the second array antennas, and has a third beam facing a third axis. The first axis, the second axis and the third axis are different from one another. Accordingly, the electronic device can provide a stable connection quality and a higher transmission rate.

20 Claims, 10 Drawing Sheets

(56) References Cited

U.S. PATENT DOCUMENTS

2017/0079459 A1* 3/2017 Filko ........................ E06B 9/24

* cited by examiner

ELECTRONIC DEVICE

CROSS-REFERENCE TO RELATED APPLICATIONS

The present application claims the benefit of U.S. Provisional Patent Application No. 63/044,206, filed on Jun. 25, 2020, the disclosure of which is hereby incorporated by reference herein in its entirety. The present application further claims priority to a CN Patent Application No. 202011294402.9, filed on Nov. 18, 2020, the disclosure of which is also hereby incorporated by reference herein in its entirety.

BACKGROUND OF THE INVENTION

Field of the Invention

The present invention relates to an electronic device, and more particularly to an electronic device in which a plurality of array antennas are arranged in a shell.

Description of the Prior Art

Accompanied by the thriving development of wireless broadband networks and mobile communication technologies, diversified electronic products (e.g., cellphones, tablet computer and laptop computers) having a wireless communication function are extensively used in mass, so that the number of antenna elements also increases with the evolving communication technologies. However, the space inside an electronic device is not expanded as the number of antenna elements increases. In addition, distances between antenna elements or between antenna elements and other electronic elements of an electronic product are also significantly reduced, further aggravating coupling issues between the antenna elements or with other electronic elements, as well as affecting the performance and communication quality of antennas, resulting in numerous new formidable challenges for designers.

SUMMARY OF THE INVENTION

In view of the above, an electronic device provided according to an embodiment of the present invention includes a body, a first array antenna, a second array antenna and a third array antenna. The body includes a first shell, which as a first side and a second side opposite to each other. The first array antenna is arranged in the first shell and adjacent to the first side, and has a first beam facing a first axis. The second array antenna is arranged in the first shell and adjacent to the second side, and has a second beam facing a second axis. The third array antenna is arranged in the first shell and located between the first array antenna and the second array antenna, and has a third beam facing a third axis. The first axis, the second axis and the third axis are different from one another.

In one embodiment of the present invention, the first array antenna, the second array antenna and the third array antenna are mmWave antennas.

In one embodiment of the present invention, the body further includes a second shell and a substrate located between the second shell and the first shell. The first array antenna is arranged on a first bearing seat of the substrate, and a bearing portion of the first bearing seat inclines by a first angle relative to the substrate, so that the first array antenna is rotated by the first angle relative to the first axis.

In one embodiment of the present invention, the second array antenna is arranged on a second bearing seat of the substrate, and a bearing portion of the second bearing seat inclines by a second angle relative to the substrate, so that the second array antenna is rotated by the second angle relative to the second axis.

In one embodiment of the present invention, the third array antenna is arranged on a third bearing seat of the substrate, and a bearing portion of the third bearing seat inclines by a third angle relative to the substrate, so that the third array antenna is rotated by the third angle relative to the third axis.

In one embodiment of the present invention, the body further includes a back cover and a first waterproof structure. The back cover is arranged on the first shell, includes a flexible portion and is movably arranged on the second shell. The first waterproof structure is arranged at a first opening of the second shell, wherein the first opening corresponds to the first array antenna. The first waterproof structure includes a waterproof plate and a waterproof wall, wherein the waterproof plate has an opening, and the waterproof wall is arranged around the opening and extends towards a direction opposite to the position of the substrate.

In one embodiment of the present invention, the body further includes a second waterproof structure arranged at a second opening of the second shell, wherein the second opening corresponds to the second array antenna and the third array antenna. The second waterproof structure includes a waterproof channel, which is arranged around the second opening.

In one embodiment of the present invention, the electronic device further includes a first radio-frequency (RF) signal processing module, a second RF signal processing module and a third RF signal processing module. The first RF signal processing module is arranged in the first shell and coupled to the first array antenna, and transmits or receives a first RF signal through the first array antenna. The second RF signal processing module is arranged in the first shell and coupled to the second array antenna, and transmits or receives a second RF signal through the second array antenna. The third RF signal processing module is arranged in the first shell and coupled to the third array antenna, and transmits or receives a third RF signal through the third array antenna.

In one embodiment of the present invention, the electronic device further includes a baseband signal processing module. The baseband signal processing module is arranged on the substrate, and is coupled to the first RF signal processing module, the second RF signal processing module and the third RF signal processing module through a first RF signal transmission line, a second RF signal transmission line and a third RF signal transmission line, respectively. The baseband signal processing module generates a baseband signal. The first RF signal processing module receives and processes the baseband signal to generate the first RF signal, the second RF signal processing module receives and processes the baseband signal to generate the second RF signal, and the third RF signal processing module receives the baseband signal to generate the third RF signal.

In one embodiment of the present invention, the electronic device further includes a phase control module. The phase control module is arranged on the substrate, and is coupled to the first RF signal processing module, the second RF signal processing module and the third RF signal processing module through a first signal control line, a second signal control line and a third signal control line, respectively. The phase control module generates a first phase control signal, a second phase control signal and a third phase control signal, to control a beam direction of the first beam, a beam direction of the second beam and a beam direction of the third beam, respectively.

In the electronic device provided according to the embodiment of the present invention, the three array antennas are arranged in the first shell, and the placed position and the inclining angle of each of the array antennas are adjusted so that each of the array antenna has a beam substantially facing a specific axis. Meanwhile, the inclining angles and beam directions of the array antennas are adjusted according to the signal quality and/or signal strength received from the three difference axes, so that the beams of the array antennas can accurately point toward a base station, preventing signal interruption from the base station. Accordingly, the electronic device and the base station are provided with a stable connection quality and a higher transmission rate in between. Further, the internal waterproof structure formed by the combination of the second shell and the back cover achieves a waterproof function for the array antennas.

The description above is merely a summary of the technical solutions of the present invention. To understand the technical means of the present invention with better clarity, be able to carry out implementations based on the disclosure of the detailed description and more easily appreciate the above and other objects, features and advantages of the present invention, preferred embodiments are described in detail with the accompanying drawings below.

DETAILED DESCRIPTION OF THE EMBODIMENTS

In some wireless communication systems (e.g., a mmWave communication system), multiple antennas can be used between a base station and a user equipment (e.g., a tablet computer) to transmit or receive signals. An electronic device provided according to an embodiment of the present invention is applicable to an electronic device such as a tablet computer or a laptop computer having a wireless communication function.

Figure 1:
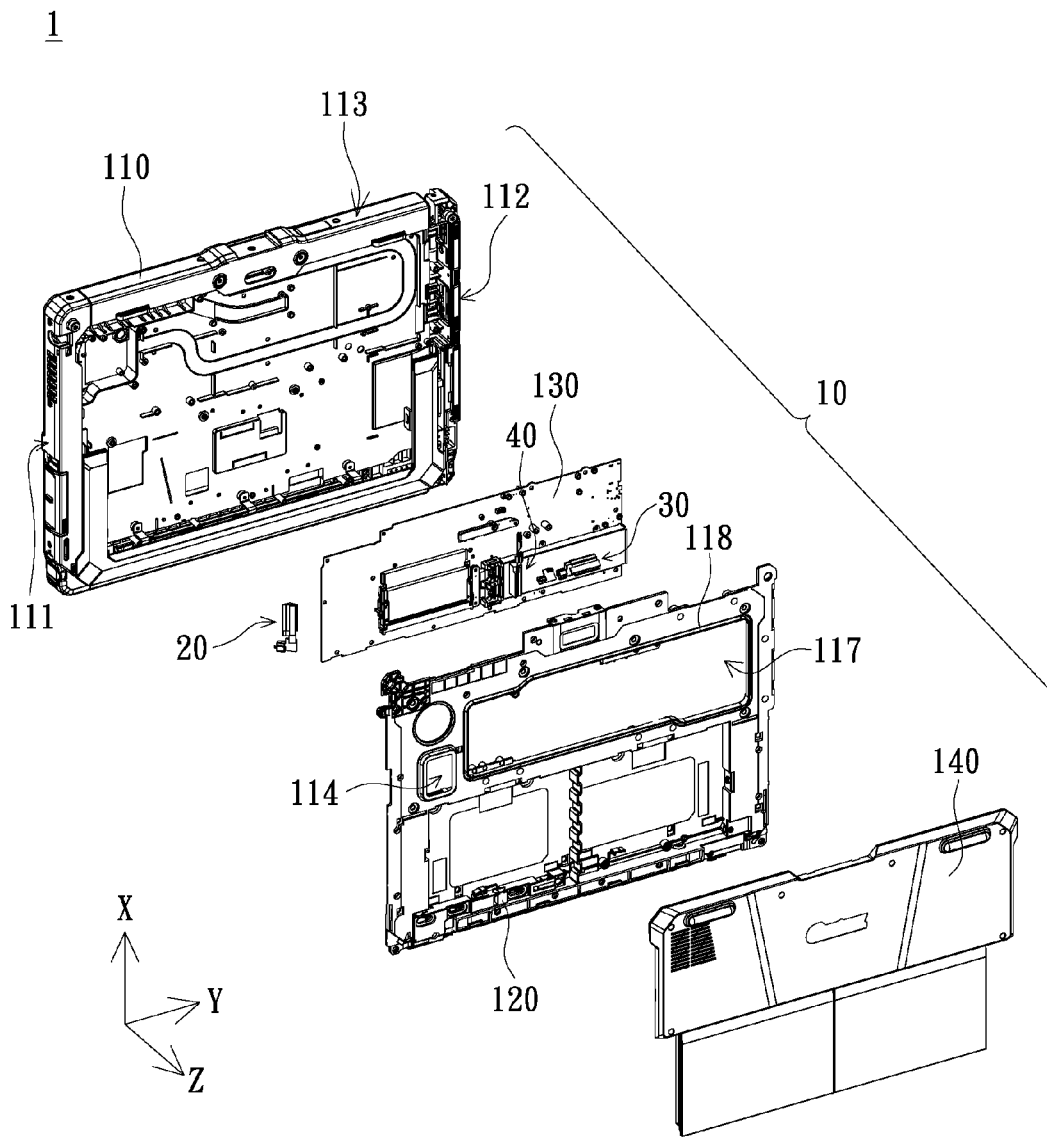
FIG. 1 is an exploded schematic diagram of an electronic device according to an embodiment of the present invention.

FIG. 1 shows an exploded schematic diagram of an electronic device according to an embodiment of the present invention. Referring to FIG. 1, the electronic device 1 provided according to an embodiment of the present invention includes a body 10, a first array antenna 20, a second array antenna 30 and a third array antenna 40. The body 10 includes a first shell 110, which has a first side 111 and a second side 112 opposite to each other. The first array antenna 20, the second array antenna 30 and the third array antenna 40 are preferably mmWave array antennas, e.g., 1×4 mmWave array antennas (each including four antenna elements having the same structure and size, e.g., patch antennas), which are preferably arranged in an accommodating space in the first shell 110 and send (i.e., to transmit) or receive radio waves. Moreover, the radio waves generated by the first array antenna 20, the second array antenna 30 and the third array antenna 40 can perform, toward a selected axis (e.g., the X-axis, Y-axis or Z-axis), beam scanning in specific directions by means of phase control, so as to detect the direction or position of a base station (not shown) near the electronic device 1 at all times.

For example, assuming that the scanning angle range is positive/negative (±) 60 degrees, the beams generated by the first array antenna 20, the second array antenna 30 and the third array antenna 40 can cover a communication range of approximately 120 degrees. In order to detect the position of a base station at all times, while scanning, the electronic device 1 adjusts in real time the beam directions of the first array antenna 20, the second array antenna 30 and the third array antenna 40 preferably according to the signal quality (e.g., a connection rate) and/or the signal strength (e.g., a received signal strength indicator (RSSI)), so that the array antennas can accurately point to the base station to thereby prevent signal interruption from the base station. Accordingly, the electronic device 1 and the base station are provided with a stable connection quality and a higher transmission rate in between.

Moreover, the beams generated by the first array antenna 20, the second array antenna 30 and the third array antenna 40 may be affected by the material (e.g., a circuit board, an electronic element, a metal element or a mechanism) of the electronic device 1, and be absorbed, reflected or deviated from a predetermined radiation angle by these substances. Thus, in one embodiment of the present invention, inclining angles of the first array antenna 20, the second array antenna 30 and the third array antenna 40 are adjusted to mitigate the influence of these substances upon the beams.

Figure 2A:
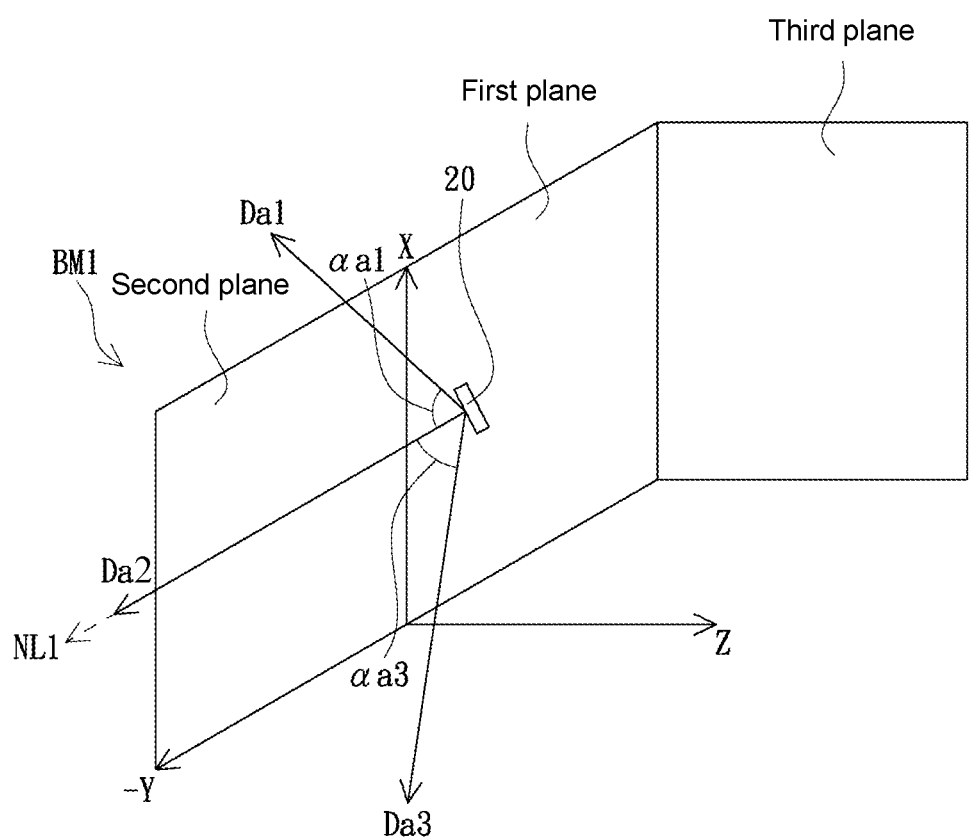
FIG. 2A is a schematic diagram of a beam of a first array antenna according to an embodiment of the present invention.

FIG. 2A shows a schematic diagram of a beam of a first array antenna according to an embodiment of the present invention. Referring to 2A, the first array antenna 20 is arranged in the first shell 110 and adjacent to the accommodating space on the first side 111, and has a first beam BM1 substantially facing a first axis (i.e., the negative Y-axis). The first array antenna 20 may be configured to face the first side 111 of the first shell 110, and pass through the left of the body 10 to transmit or receive signals in a mmWave band. Alternatively speaking, the first array antenna 20 may be arranged on an XY-plane (defined as a first plane) formed by the X-axis and the Y-axis and generate the first beam BM1 of different angles toward the first axis, wherein the first beam BM1 is parallel to an XnegativeY-plane (defined as a second plane) formed by the X-axis and the negative Y-axis, so that the first array antenna 20 can perform scanning on the first plane and substantially toward a direction of the first axis.

For example, a positive shift angle $\alpha a1$ (e.g., 0 degree to 60 degrees) is present between a beam direction Da1 of the first beam BM1 and a first normal direction NL1 (defined as being perpendicular to a third plane, which is an XZ-plane formed by the X-axis and the Z-axis), a shift angle between a beam direction Da2 of the first beam BM1 and the first normal direction NL1 is 0 degree, and a negative shift angle $\alpha a3$ (e.g., 0 degree to −60 degrees) is present between a beam direction Da3 of the first beam BM1 and the first normal direction NL1. In other words, when the scanning angle range of the first array antenna 20 is ±60 degrees, the first array antenna 20 can cover a communication range of 120 degrees.

Thus, the electronic device 1 can dynamically adjust the beam direction of the first array antenna 20 according to the signal quality and/or the signal strength, so that the first beam BM1 can accurately point toward a base station to thereby prevent signal interruption. Accordingly, the electronic device 1 can provide a stable connection quality and a higher transmission rate on the first plane and substantially toward a direction of the first axis.

Figure 2B:
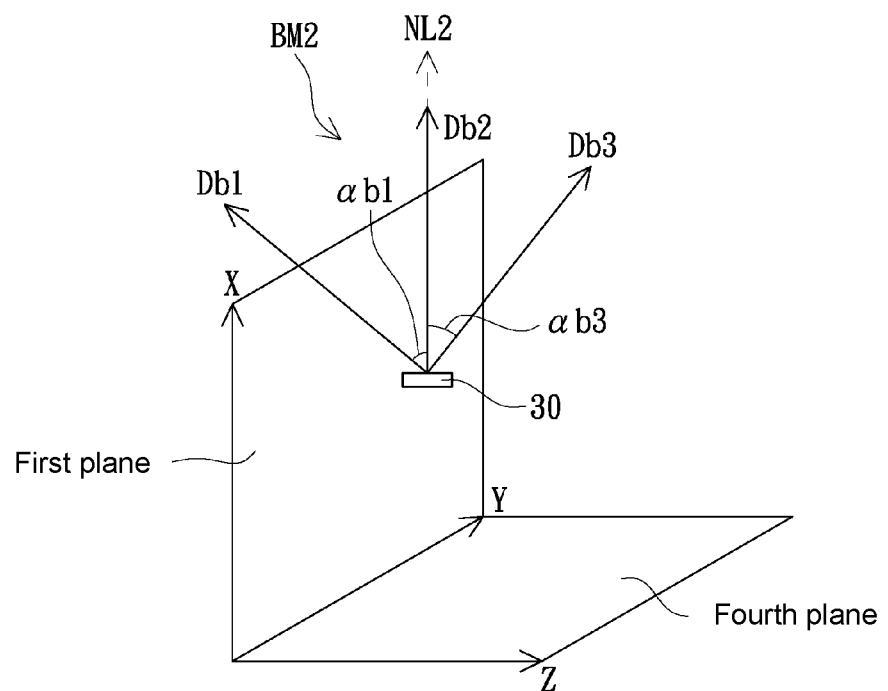
FIG. 2B is a schematic diagram of a beam of a second array antenna according to an embodiment of the present invention.

FIG. 2B shows a schematic diagram of a beam of a second array antenna according to an embodiment of the present invention. Referring to FIG. 2B, the second array antenna 30 is arranged in the first shell 110 and adjacent to the accommodating space on the second side 112, and has a second beam BM2 substantially facing a second axis (i.e., the X-axis). The second beam BM2 of the second array antenna 30 is configured to substantially face an upper side 113 of the first shell 110, and pass through the top of the body 10 to transmit or receive signals in a mmWave band. Alternatively speaking, the second array antenna 30 may be arranged the first plane and generate the second beam BM2 (parallel to the first plane) of different angles toward the second axis, so that the second array antenna 30 can perform scanning on the first plane and substantially toward a direction of the second axis.

For example, a positive shift angle $\alpha b1$ (e.g., 0 degree to 60 degrees) is present between a beam direction Db1 of the second beam BM2 and a second normal direction NL2 (defined as being perpendicular to a fourth plane, which is a YZ-plane formed by the Y-axis and the Z-axis), a shift angle between a beam direction Db2 of the second beam BM2 and the second normal direction NL2 is 0 degree, and a negative shift angle $\alpha b3$ (e.g., 0 degree to −60 degrees) is present between a beam direction Db3 of the second beam BM2 and the second normal direction NL2. In other words, when the scanning angle range of the second array antenna 30 is ±60 degrees, the second array antenna 30 can cover a communication range of 120 degrees.

Thus, the electronic device 1 can dynamically adjust the beam direction of the second array antenna 30 according to the signal quality and/or the signal strength, so that the second beam BM2 can accurately point toward a base station to thereby prevent signal interruption. Accordingly, the electronic device 1 can provide a stable connection quality and a higher transmission rate on the first plane and substantially toward a direction of the second axis.

Figure 2C:
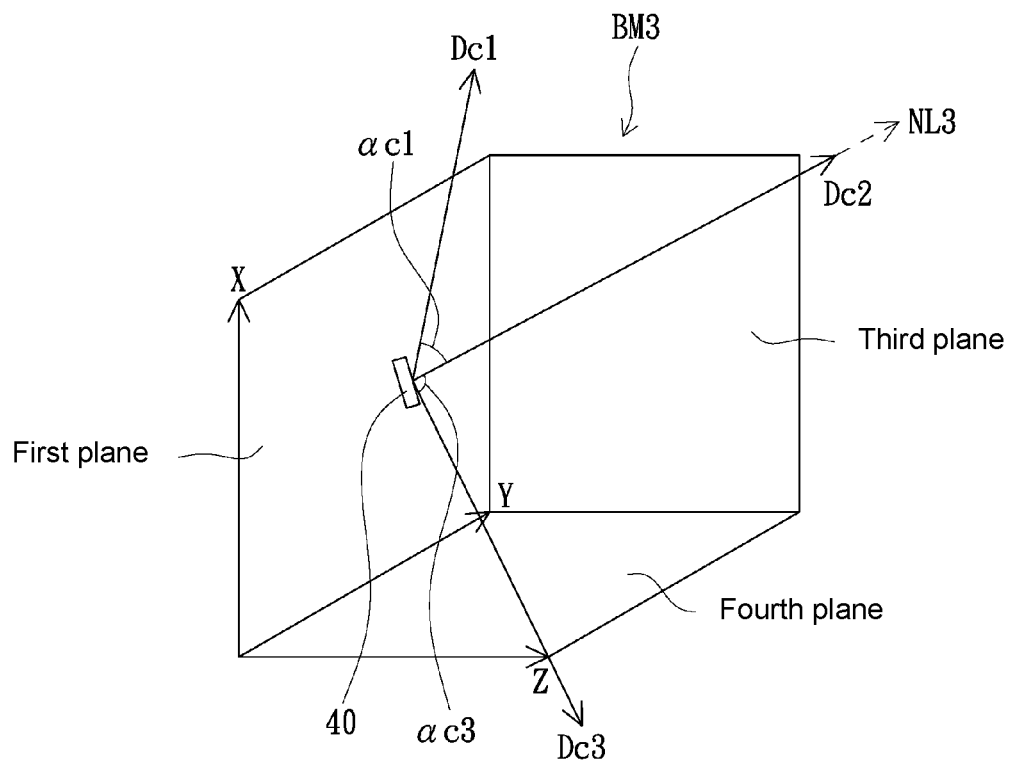
FIG. 2C is a schematic diagram of a beam of a third array antenna according to an embodiment of the present invention.

FIG. 2C shows a schematic diagram of a beam of a third array antenna according to an embodiment of the present invention. Referring to FIG. 2C, the third array antenna 40 is arranged in the accommodating space in the first shell 110 and located between the first array antenna 20 and the second array antenna 30, and has a third beam BM3 substantially facing a third axis (i.e., the Y-axis). The third beam BM3 of the third array antenna 40 is configured to substantially face the second side 112 of the first shell 110, and pass through the right of the body 10 to transmit or receive signals in a mmWave band. Alternatively speaking, the third array antenna 40 may be arranged the first plane and generate the third beam BM3 (parallel to the first plane) of different angles toward the third axis, so that the third array antenna 40 can perform scanning on the first plane and substantially toward a direction of the third axis.

For example, a positive shift angle $\alpha c1$ (e.g., 0 degree to 60 degrees) is present between a beam direction Dc1 of the third beam BM3 and a third normal direction NL3 (defined as being perpendicular to a third plane and opposite to the first normal direction NL1), a shift angle between a beam direction Dc2 of the third beam BM3 and the third normal direction NL3 is 0 degree, and a negative shift angle $\alpha c3$ (e.g., 0 degree to −60 degrees) is present between a beam direction Dc3 of the third beam BM3 and the third normal direction NL3. In other words, when the scanning angle range of the third array antenna 30 is ±60 degrees, the third array antenna 40 can cover a communication range of 120 degrees.

Thus, the electronic device 1 can dynamically adjust the beam direction of the third array antenna 40 according to the signal quality and/or the signal strength, so that the third beam BM3 can accurately point toward a base station to thereby prevent signal interruption. Accordingly, the electronic device 1 can provide a stable connection quality and a higher transmission rate on the first plane and substantially toward a direction of the third axis.

It should be noted that, the first axis, the second axis and the third axis may be substantially different from one another. For example but not limited to, the first axis may be substantially perpendicular to the second axis, the third axis may be substantially perpendicular to the second axis, and the first axis and the third axis may differ by 180 degrees.

As described above, the electronic device 1 provided according to an embodiment of the present invention dynamically adjusts, according to the signal quality and/or the signal strength received by the first array antenna 20 substantially facing the first axis, the second array antenna 30 substantially facing the second axis and the third array antenna 40 substantially facing the third axis, the beam directions of the first array antenna 20, the second array antenna 30 and the third array antenna 40, so that the first beam BM1, the second beam BM2 and the third beam BM3 can accurately point toward the base station to thereby prevent signal interruption. Accordingly, the electronic device 1 and the base station are provided with a stable connection quality and a higher transmission rate in between. It should be understood that the first axis, the second axis and the third axis may be any three selected from the X-axis, negative X (−X)-axis, Y-axis, negative Y (−Y)-axis, Z-axis and negative Z (−Z)-axis.

Moreover, the body 10 of the electronic device 1 provided according to an embodiment of the present invention further includes a second shell 120 and a substrate 130. The substrate 130 is, for example, a printed circuit board, and is preferably arranged in the first shell 110 and located between the first shell 110 and the second shell 120.

Figure 3A:
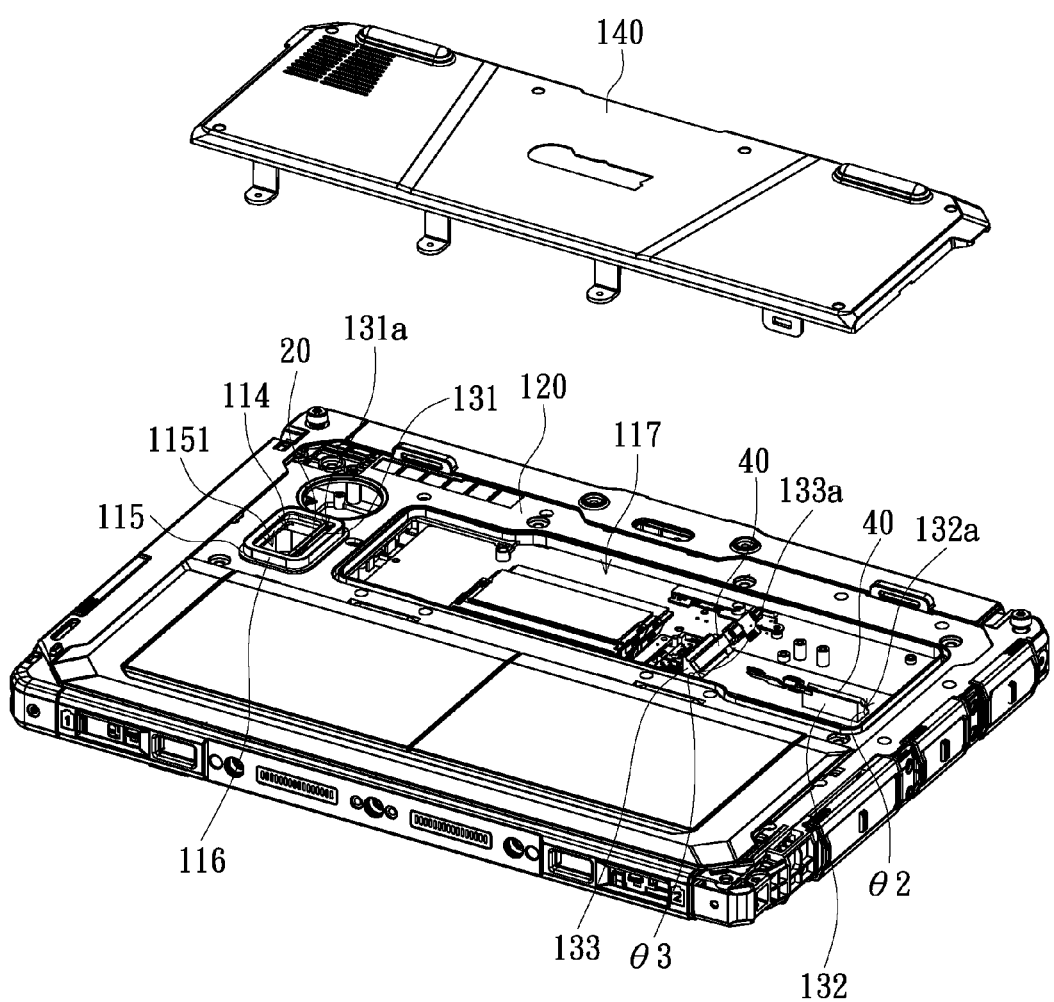
FIG. 3A is a top schematic diagram of an electronic device having been taken out of a back cover according to an embodiment of the present invention.
Figure 4A:
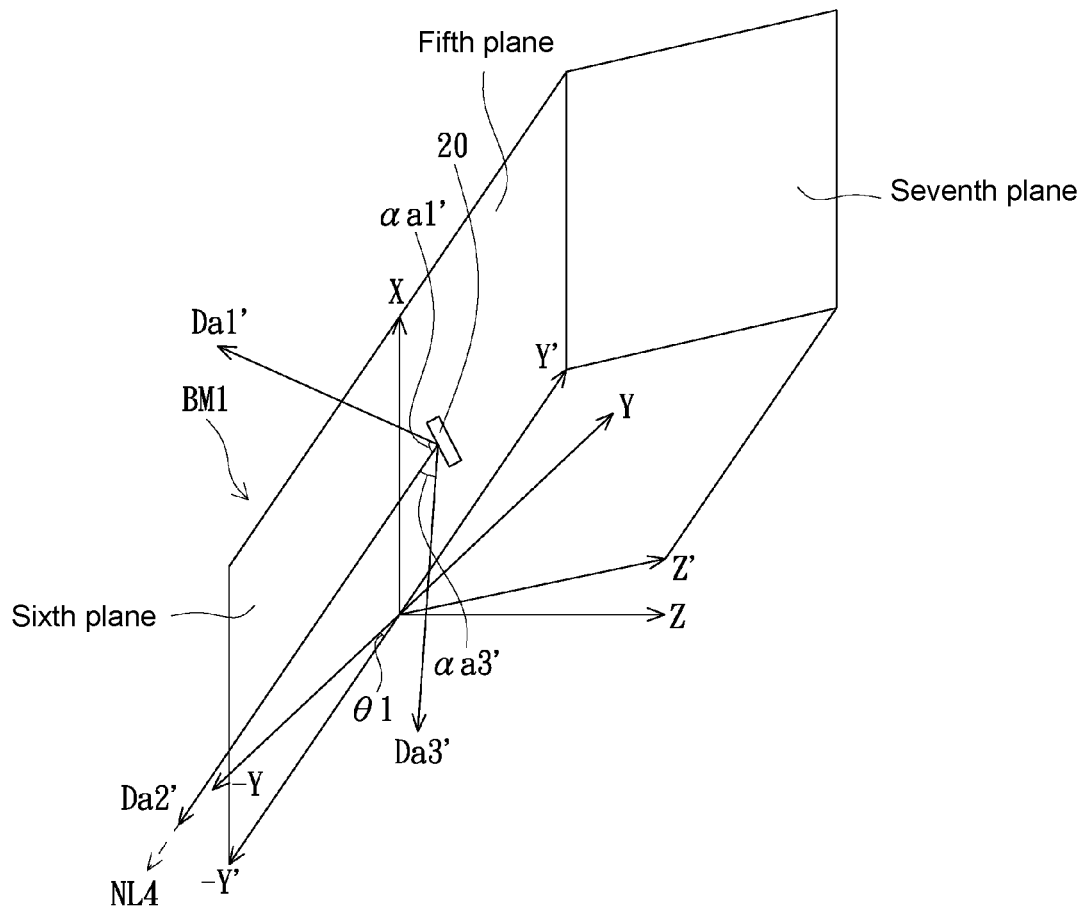
FIG. 4A is a schematic diagram of a beam of a first array antenna according to another embodiment of the present invention.

FIG. 3A shows a top schematic diagram of an electronic device having been taken out of a back cover according to an embodiment of the present invention. FIG. 4A shows a schematic diagram of a beam of a first array antenna according to another embodiment of the present invention. Referring to FIG. 3A and FIG. 4A, in one embodiment of the present invention, the body 10 of the electronic device 1 further includes a first bearing seat 131, a second bearing seat 132 and a third bearing seat 133. The first array antenna 20 is preferably arranged on the first bearing seat 131 on a back surface of the substrate 130, the second array antenna 30 is preferably arranged on the second bearing seat 132 on the back surface of the bearing seat 130, and the third array antenna 40 is preferably arranged on the third bearing seat 133 on the back surface of the substrate 130.

The first bearing set 131 includes a bearing portion 131a (preferably a sloped surface) bearing the first array antenna 20, wherein the bearing portion 131a inclines or shifts by a first angle θ1 relative to the back surface of the substrate 130, and the first angle θ1 is preferably between 30 degrees and 45 degrees. Alternatively speaking, the an included angle (i.e., the first angle θ1) is present between the bearing portion 131a of the first bearing seat 131 and the back surface of the substrate 130, so that the first array antenna 20 is rotated or inclines by the first angle θ1 relative to the first axis. It should be understood that the first array antenna 20 arranged on the first bearing seat 131 at this point is not parallel to the first plane, but is parallel to a surface (defined as a fifth plane) formed by the X-axis and the Y'-axis.

The first array antenna 20 may be configured to substantially face between the first side 111 of the first shell 110 and the second shell 120, and pass through the back surface of the body 10 to transmit or receive signals in a mmWave band. Further, the first array antenna 20 has the first beam BM1 (parallel to a sixth plane, which is an XnegativeY'-plane formed by the X-axis and the negative Y'-axis) substantially facing a first inclined axis (defined as the negative Y'-axis, which shifts by the first angle θ1 relative to the negative Y-axis) and generating different angles, so that the first array antenna 20 can perform scanning on the fifth plane and substantially toward the first inclined axis.

For example, a positive shift angle αa1' (e.g., 0 degree to 60 degrees) is present between a beam direction Da1' of the first beam BM1 and a fourth normal direction NL4 (defined as being perpendicular to a seventh plane, which is an XZ'-plane formed by the X-axis and the Z'-axis), a shift angle between a beam direction Da2' of the first beam BM1 and the fourth normal direction NL4 is 0 degree, and a negative shift angle αa3' (e.g., 0 degree to −60 degrees) is present between a beam direction Da3' of the first beam BM1 and the fourth normal direction NL4. In other words, when the scanning angle range of the first array antenna 20 is ±60 degrees, the first array antenna 20 can cover a communication range of 120 degrees. Thus, the electronic device 1 can dynamically adjust the beam direction of the first array antenna 20 according to the signal quality and/or the signal strength, so that the first beam BM1 can accurately point toward a base station to thereby prevent signal interruption. Accordingly, the first array antenna 20 can provide the electronic device 1 with a stable connection quality and a higher transmission rate on the fifth plane and substantially toward a direction of the first inclined axis.

Moreover, because the material (e.g., the first shell 110, the second shell 120, the substrate 130 and electronic elements on the substrate 130) of the electronic device 1 is mostly parallel to the first plane, and the first array antenna 20 arranged on the first bearing seat 131 is not parallel to the first plane but is parallel to the fifth plane, most of the first beam BM1 is evaded from the foregoing material. Therefore, absorption, reflection or shifting from an original predetermined radiation angle caused by the foregoing material can be significantly reduced.

Figure 4B:
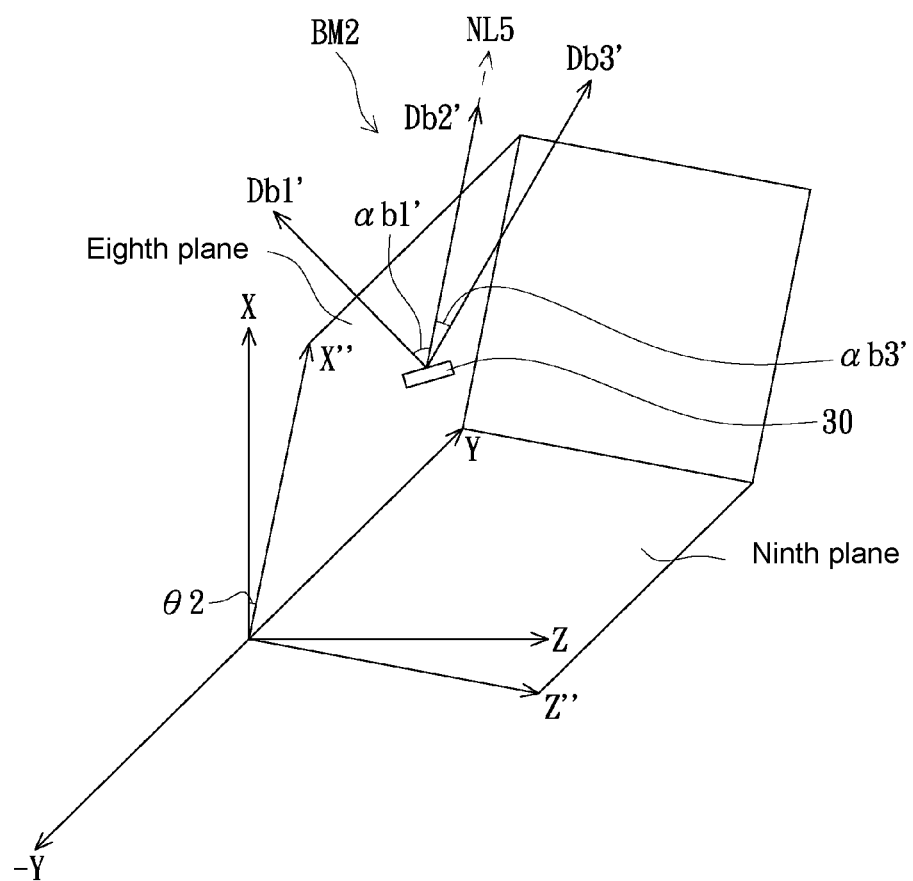
FIG. 4B is a schematic diagram of a beam of a second array antenna according to another embodiment of the present invention.

FIG. 4B shows a schematic diagram of a beam of a second array antenna according to another embodiment of the present invention. Referring to FIG. 4B, the second bearing seat 132 has a bearing portion 132a (preferably a sloped surface) bearing the second array antenna 30, wherein the bearing portion 132a inclines or shifts by a second angle θ2 (e.g., 45 degrees) relative to the back surface of the substrate 130, so that the second array antenna 30 is rotated or inclines by the second angle θ2 relative to the second axis. It should be understood that the second array antenna 30 arranged on the second bearing seat 132 is not parallel to the first plane, but is parallel to an X"Y-plane (defined as an eighth plane) formed by the X"-axis and the Y-axis. The second array antenna 30 may be configured to substantially face between the upper side 113 of the first shell 110 and the second shell 120, and pass through the top and the back surface of the body 10 to transmit or receive signals in a mmWave band.

Further, an included angle (defined as the second angle θ2) is present between the bearing portion 132a of the second bearing seat 132 and the back surface of the substrate 130, in a way that the second array antenna 30 has a second beam BM2 (parallel to the eighth plane) substantially facing a second inclined axis (defined as the X"-axis, which is an axis shifted by the second angle θ2 relative to the X-axis) and generating different angles, so that the second array antenna 30 can perform scanning on the eighth plane and substantially toward the second inclined axis.

For example, a positive shift angle αb1' (e.g., 0 degree to 60 degrees) is present between a beam direction Db1' of the second beam BM2 and a fifth normal direction NL5 (defined as being perpendicular to a ninth plane, which is a YZ"-plane formed by the Y-axis and the Z"-axis), a shift angle between a beam direction Db2' of the second beam BM2 and the fifth normal direction NL5 is 0 degree, and a negative shift angle αb3' (e.g., 0 degree to −60 degrees) is present between a beam direction Db3' of the second beam BM2 and the fifth normal direction NL5. In other words, when the scanning angle range of the second array antenna 30 is ±60 degrees, the second array antenna 30 can cover a communication range of 120 degrees.

Thus, the electronic device 1 can dynamically adjust the beam direction of the second array antenna 30 according to the signal quality and/or the signal strength, so that the second beam BM2 can accurately point toward a base station to thereby prevent signal interruption. Accordingly, the second array antenna 30 can provide the electronic device 1 with a stable connection quality and a higher transmission rate on the eighth plane and substantially toward a direction of the second inclined axis.

Moreover, because the foregoing material of the electronic device 1 is mostly parallel to the first plane, and the second array antenna 30 arranged on the second bearing seat 132 is not parallel to the first plane but is parallel to the eighth plane, most of the second beam BM2 is evaded from the foregoing material. Therefore, absorption, reflection or shifting from an original predetermined radiation angle caused by the foregoing material can be significantly reduced.

Figure 4C:
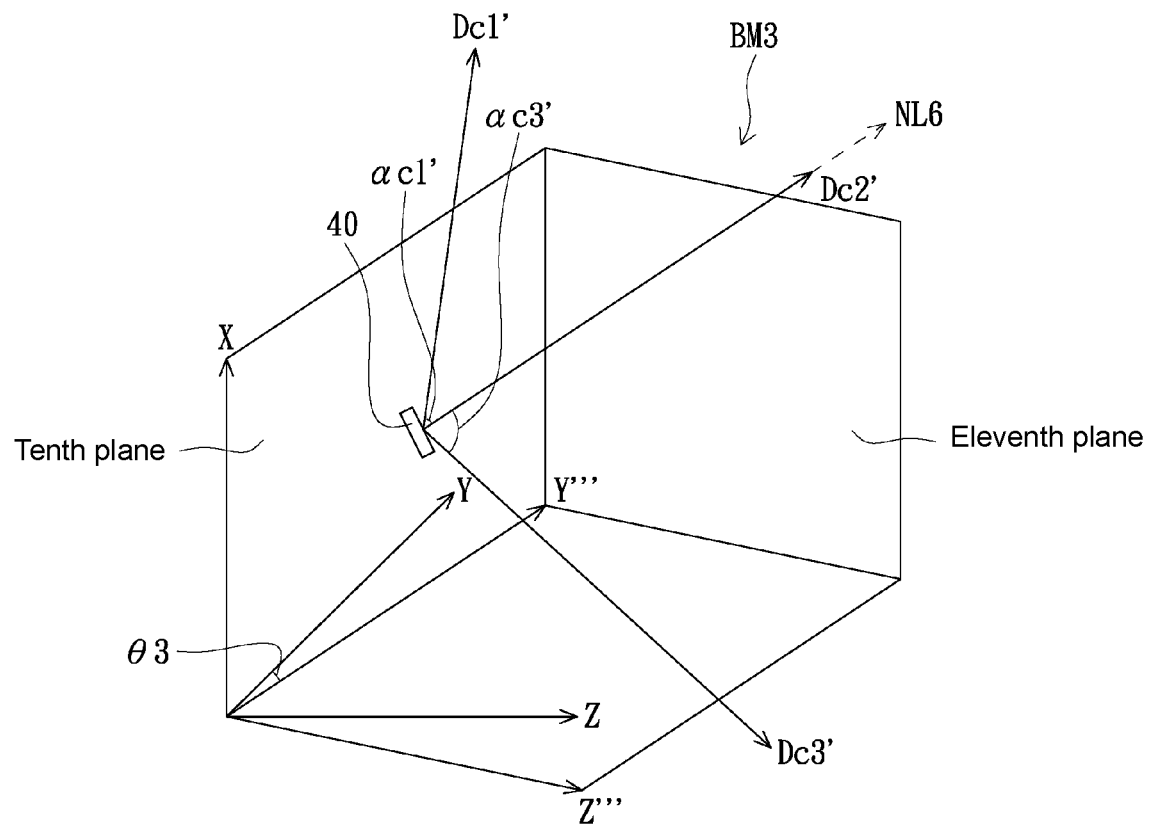
FIG. 4C is a schematic diagram of a beam of a third array antenna according to another embodiment of the present invention.

FIG. 4C shows a schematic diagram of a beam of a third array antenna according to another embodiment of the present invention. Referring to FIG. 4C, the third bearing seat 133 has a bearing portion 133a (preferably a sloped surface) bearing the third array antenna 40, wherein the bearing portion 133a inclines or shifts by a third angle θ3 (e.g., 45 degrees) relative to the back surface of the substrate 130, so that the third array antenna 40 is rotated or inclines by the third angle θ3 relative to the third axis. It should be understood that the third array antenna 40 arranged on the third bearing seat 133 is not parallel to the first plane, but is parallel to an XY'''-plane (defined as a tenth plane) formed by the X-axis and the Y'''-axis. The third array antenna 40 may be configured to substantially face between the second side 112 of the first shell 110 and the second shell 120, and pass through the back surface of the body 10 to transmit or receive signals in a mmWave band.

Further, an included angle (i.e., the third angle $\theta 3$) is present between the bearing portion 133a of the third bearing seat 133 and the back surface of the substrate 130, in a way that the third array antenna 40 has a third beam BM3 (parallel to the tenth plane) substantially facing a third inclined axis (defined as the Y'''-axis, which is an axis shifted by the third angle $\theta 3$ relative to the Y-axis) and generating different angles, so that the third array antenna 40 can perform scanning on the tenth plane and substantially toward the third inclined axis.

For example, a positive shift angle $\alpha c1'$ (e.g., 0 degree to 60 degrees) is present between a beam direction Dc1' of the third beam BM3 and a sixth normal direction NL6 (defined as being perpendicular to an eleventh plane, which is an XZ'''-plane formed by the X-axis and the Z'''-axis), a shift angle between a beam direction Dc2' of the third beam BM3 and the sixth normal direction NL6 is 0 degree, and a negative shift angle $\alpha c3'$ (e.g., 0 degree to −60 degrees) is present between a beam direction Dc3' of the third beam BM3 and the sixth normal direction NL6. In other words, when the scanning angle range of the third array antenna 40 is ±60 degrees, the second array antenna 30 can cover a communication range of 120 degrees.

Thus, the electronic device 1 can adjust the beam direction of the third array antenna 40 in real time according to the received signal strength indicator received, so that the third beam BM3 can accurately point toward a base station to thereby prevent signal interruption. Accordingly, the third array antenna 40 can provide the electronic device 1 with a stable connection quality and a higher transmission rate on the tenth plane and substantially toward a direction of the third inclined axis.

It should be noted that, the first angle $\theta 1$, the second angle $\theta 2$ and the third angle $\theta 3$ may substantially be the same or different.

Moreover, because the foregoing material of the electronic device 1 is mostly parallel to the first plane, and the third array antenna 40 arranged on the third bearing seat 133 is not parallel to the first plane but is parallel to the tenth plane, most of the third beam BM3 is evaded from the foregoing material. Therefore, absorption, reflection or shifting from an original predetermined radiation angle by the foregoing material can be significantly reduced.

As described above, the electronic device 1 provided according to an embodiment of the present invention dynamically adjusts, according to the signal quality and/or the signal strength received by the first array antenna 20 substantially facing the first inclined axis, the second array antenna 30 substantially facing the second inclined axis and the third array antenna 40 substantially facing the third inclined axis, the beam directions of the first array antenna 20, the second array antenna 30 and the third array antenna 40, so that the first beam BM1, the second beam BM2 and the third beam BM3 can accurately point toward the base station to thereby prevent signal interruption. Accordingly, the electronic device 1 and the base station are provided with a stable connection quality and a higher transmission rate in between. It should be understood that the first inclined axis, the second inclined axis and the third inclined axis may be any three selected from the X-axis shifted by a specific angle, negative X-axis±$\theta$, Y-axis±$\theta$, negative Y-axis±$\theta$, Z-axis±$\theta$ and negative Z-axis±$\theta$, wherein $\theta$ is an angle by which the bearing portions 131a to 133a incline or are shifted relative to the back surface of the substrate 130.

In another embodiment of the present invention, the electronic device 1 further includes a first angle control module (not shown), a second angle control module (not shown) and a third angle control module (not shown), which are coupled to a processor (not shown) and coupled to the first bearing seat 131, the second bearing seat 132 and the third bearing seat 133, respectively, to adjust the included angles of the first bearing seat 131, the second bearing seat 132 and the third bearing seat 133 from the substrate 130, respectively, according to an angle control signal outputted by the processor, so that first array antenna 20 is rotated or inclines by the first angle $\theta 1$ relative to the first axis, the second array antenna 30 is rotated or inclines by the second angle $\theta 2$ relative to the second axis, and the third array antenna 40 is rotated or inclines by the third angle $\theta 3$ relative to the third axis. In this embodiment, the first angle control module, the second angle control module and the third angle control module are preferably step motors. The processor can output the angle control signal to the angle control modules according to the signal quality and/or the signal strength, thereby adjusting the inclining angles of the first array antenna 20, the second array antenna 30 and the third array antenna 40.

Figure 5:
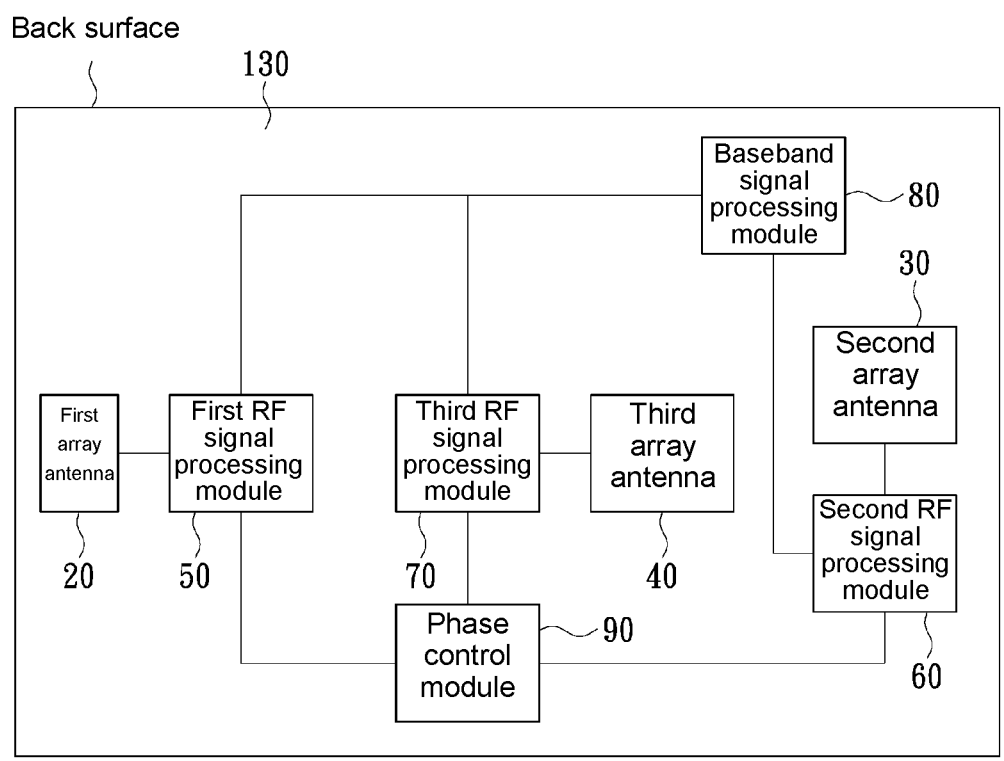
FIG. 5 is a configuration schematic diagram of elements of an electronic device according to an embodiment of the present invention.

FIG. 5 shows a configuration schematic diagram of elements of an electronic device according to an embodiment of the present invention. Referring to FIG. 5, the electronic device 1 provided according to an embodiment of the present invention further includes a first radio-frequency (RF) signal processing module 50, a second RF signal processing module 60 and a third RF signal processing module 70. The first RF signal processing module 50 is arranged in the first shell 110 and coupled to the first array antenna 20, and transmits or receives a first RF signal through the first array antenna 20. The second RF signal processing module 60 is arranged in the first shell 110 and coupled to the second array antenna 30, and transmits or receives a second RF signal through the second array antenna 30. The third RF signal processing module 70 is arranged in the first shell 110 and coupled to the third array antenna 40, and transmits or receives a third RF signal through the third array antenna 40. Each of these RF signal processing modules may include an antenna switch, a filter, a low-noise input amplifier, a power amplifier, a phase shifter and an RF transceiver. In another embodiment of the present invention, the first RF signal processing module 50 and the first array antenna 20 may be integrated into one module, the second RF signal processing module 60 and the second array antenna 30 may be integrated into one module, and the third RF signal processing module 70 and the third array antenna 40 may be integrated into one module.

The electronic device 1 provided according to an embodiment of the present invention further includes a baseband signal processing module 80. The baseband signal processing module 80 is preferably arranged on the substrate 130, and is coupled to the first RF signal processing module 50, the second RF signal processing module 60 and the third RF signal processing module 70 through a first RF signal transmission line, a second RF signal transmission line and a third RF signal transmission line, respectively. The baseband signal processing module 80 generates a baseband signal (i.e., a digital signal) to the foregoing RF signal processing modules (i.e., the first RF signal processing module 50, the second RF signal processing module 60 and the third RF signal processing module 70), which generate RF signals according to the baseband signal. Further, the first RF signal processing module 50 receives and processes the baseband signal to generate the first RF signal, the second RF signal processing module 60 receives and processes the baseband signal to generate the second RF signal, and the third RF signal processing module 70 receives and processes the baseband signal to generate the third RF signal. It should be noted that, the baseband signal processing module 80 is preferably coupled to the foregoing processor (i.e., coupled to the processor of the angle control module). The foregoing processor may transmit a set of information to the baseband signal processing module 80, and the baseband signal processing module 80 generates a baseband signal according to the information. The baseband signal processing module 80 may include a baseband processor.

The electronic device 1 provided according to an embodiment of the present invention further includes a phase control module 90. The phase control module 90 is preferably arranged on the substrate 130, and is preferably coupled to the first RF signal processing module 50, the second RF signal processing module 60 and the third RF signal processing module 70 through a first signal control line, a second signal control line and a third signal control line, respectively. The phase control module 90 generates a first phase control signal, a second phase control signal and a third phase control signal to adjust the beam direction of the first beam BM1, the beam direction of the second beam BM2 and the beam direction of the third beam BM3, respectively. Further, the phase control module 90 may transmit a control signal to the first RF signal processing module 50 through the first signal control line to control the phase shift amount of the shifter of the first RF signal processing module 50, so that the phase of a feed signal of the first array antenna 20 is changed to further adjust the beam direction of the first BM1, thereby achieving the function of scanning back and forth in the first axis or the first inclined axis by a predetermined scanning angle (preferably ±60 degrees) and allowing the first beam BM1 to cover a 120-degree range. Similarly, the phase control module 90 can adjust the beam directions of the second beam BM2 and the third beam BM3 by the foregoing control method, and associated details are omitted herein.

Figure 3B:
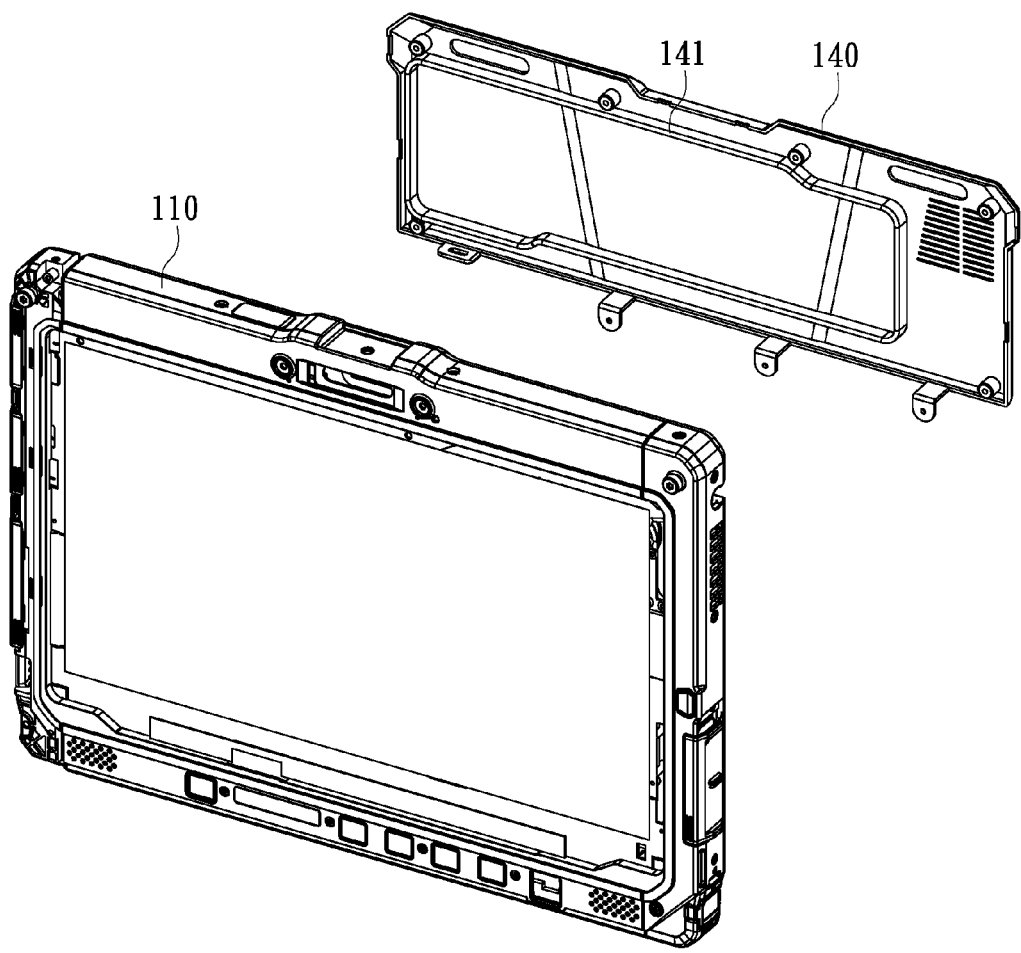
FIG. 3B is a schematic diagram of the electronic device in FIG. 3A from another viewing angle.

FIG. 3B shows a schematic diagram of the electronic device in FIG. 3A from another viewing angle. Referring to FIG. 3A and FIG. 3B, the body 10 of the electronic device 1 provided according to an embodiment of the present invention further includes a back cover 140 and a first waterproof structure. The back cover 140 includes a flexible portion 141, and is movably arranged on the second shell 120, wherein the flexible portion 141 is preferably shaped as a rib. The first waterproof structure is arranged at a first opening 114 of the second shell 120, wherein the first opening 114 corresponds to the first array antenna 20. The first waterproof structure 120 includes a waterproof plate 115 and a waterproof wall 116, wherein the waterproof plate 115 has an opening 1151, and the waterproof wall 116 is arranged around the opening 1151 and extends toward a direction substantially opposite to the position of the substrate 130. In an embodiment of the present invention, the material of the first waterproof structure may be a flexible material such as rubber, silicone or soft plastic.

Moreover, the flexible portion 141 is arranged on an inner surface of the back cover 140 by means of attachment, and the material of the flexible portion 141 may be a flexible material such as soft plastic, rubber, silicone or foam sponge. The flexible portion 141 may also be arranged on the inner surface of the back cover 140 by means of injection or locking; however, the present invention is not limited thereto. For example, the back cover 140 is formed of hard plastic by injection molding, and soft plastic is embedded on the back cover 140 to integrally form the flexible portion 141. Further, in other embodiments, the material of the flexible portion may be a flexible material selected according to actual requirements.

The body 10 of the electronic device 1 provided according to an embodiment of the present invention further includes a second waterproof structure, which is arranged at a second opening 117 of the second shell 120, wherein the second opening 117 corresponds to the second array antenna 30 and the third array antenna 40. The second waterproof structure includes a waterproof channel 118. The waterproof channel 118 is arranged around the second opening 117, and is preferably shaped as a recess.

When the back cover 140 is assembled with the second shell 120, the flexible portion 141 of the back cover 140 is tightly abutted against the waterproof channel 118 of the second waterproof structure and seals the second opening 117 to form a waterproof space, achieving effects of sealing and blocking water infiltration. Thus, without the condition of additional waterproofing or sealing, the second array antenna 30 and the third array antenna 40 are provided with a waterproof function using the back cover 140 with waterproofness. Meanwhile, the inner surface of the back over 140 is also tightly abutted against the waterproof wall 116 of the first waterproof structure and seals the opening 1151 to form a waterproof space, achieving effects of sealing and blocking water infiltration. Thus, without the condition of additional waterproofing and sealing, the first array antenna 20 is provided with a waterproof function using the back cover 140 with waterproofness.

In conclusion, in the electronic device provided according to the embodiment of the present invention, the three array antennas are arranged in the first shell, and the placed position and the inclining angle of each of the array antennas are adjusted so that each of the array antenna has a beam substantially facing a specific axis. Meanwhile, the inclining angles and beam directions of the array antennas are adjusted according to the signal quality and/or signal strength received from the three difference axes, so that the beams of the array antennas can accurately point toward a base station, preventing signal interruption from the base station. Accordingly, the electronic device and the base station are provided with a stable connection quality and a higher transmission rate in between. Further, the internal waterproof structure formed by the combination of the second shell and the back cover achieves a waterproof function for the array antennas.

While the invention has been described by way of the embodiments, it is to be understood that the invention is not limited thereto. Slightly variations and modifications can be made by a person skilled in the art without departing from the spirit and scope of the present invention. Therefore, the scope of protection of the present invention should be accorded with the broadest interpretation of the appended claims.

What is claimed is:

1. An electronic device, comprising:
  a body, comprising a first shell, a second shell, a back cover, and a first waterproof structure, wherein the first shell has a first side, a second side opposite to the first side, and an upper side extending between the first side and the second side such that the first side and the second side are on diametrically opposite ends of the upper side, the first waterproof structure defines a protrusion extending from a surface of the back cover facing the second shell, and the second shell defines a groove configured to receive the protrusion;
a first array antenna, arranged in the first shell and adjacent to the first side, the first array antenna having a first beam radiating in a first direction towards the first side;
a second array antenna, arranged in the first shell and adjacent to the second side, the second array antenna having a second beam radiating in a second direction towards the upper side; and
a third array antenna, arranged in the first shell and located between the first array antenna and the second array antenna, the third array antenna having a third beam radiating in a third direction towards the second side.

2. The electronic device according to claim 1, wherein the first array antenna, the second array antenna and the third array antenna are mm Wave antennas.

3. The electronic device according to claim 1, wherein the body further comprises a substrate located between the second shell and the first shell, the first array antenna is arranged on a first bearing seat of the substrate, and a bearing portion of the first bearing seat inclines by a non-zero first angle relative to the substrate.

4. The electronic device according to claim 3, wherein the second array antenna is arranged on a second bearing seat of the substrate, and a bearing portion of the second bearing seat inclines by a second angle relative to the substrate, the second bearing seat defines a second protrusion extending from a surface of the substrate, and the second bearing seat has a triangular cross-section perpendicular to a longest dimension of the second protrusion.

5. The electronic device according to claim 4, wherein the third array antenna is arranged on a third bearing seat of the substrate, and a bearing portion of the third bearing seat inclines by a third angle relative to the substrate.

6. The electronic device according to claim 5, wherein the body further comprises a second waterproof structure, the second waterproof structure is arranged at a first opening of the second shell, the first opening corresponds to the first array antenna, the second waterproof structure comprises a waterproof plate and a waterproof wall, the waterproof plate has an opening, and the waterproof wall is arranged around the opening and extends toward a direction opposite to a position of the substrate.

7. The electronic device according to claim 6, wherein first waterproof structure is arranged at a second opening of the second shell, the second opening corresponds to the second array antenna and the third array antenna, the groove is a waterproof channel, and the waterproof channel is arranged around the second opening such that the waterproof channel encircles the second array antenna and the third array antenna.

8. The electronic device according to claim 5, further comprising:
a first radio-frequency (RF) signal processing module, arranged in the first shell and coupled to the first array antenna, transmitting or receiving a first RF signal through the first array antenna;
a second RF signal processing module, arranged in the first shell and coupled to the second array antenna, transmitting or receiving a second RF signal through the second array antenna; and
a third RF signal processing module, arranged in the first shell and coupled to the third array antenna, transmitting or receiving a third RF signal through the third array antenna.

9. The electronic device according to claim 8, further comprising:
a baseband signal processing module, arranged on the substrate, coupled to the first RF signal processing module, the second RF signal processing module and the third RF signal processing module through a first RF signal transmission line, a second RF signal transmission line and a third RF signal transmission line, respectively;
wherein, the baseband signal processing module generates a baseband signal, the first RF signal processing module receives and processes the baseband signal to generate the first RF signal, the second RF signal processing module receives and processes the baseband signal to generate the second RF signal, and the third RF signal processing module receives and processes the baseband signal to generate the third RF signal.

10. The electronic device according to claim 8, further comprising:
a phase control module, arranged on the substrate, coupled to the first RF signal processing module, the second RF signal processing module and the third RF signal processing module through a first signal control line, a second signal control line and a third signal control line, respectively;
wherein, the phase control module generates a first phase control signal, a second phase control signal and a third phase control signal to adjust a beam direction of the first beam, a beam direction of the second beam and a beam direction of the third beam, respectively.

11. The electronic device according to claim 1, wherein the first array antenna, the second array antenna, and the third array antenna are patch antennas.

12. The electronic device according to claim 1, wherein the second direction is perpendicular to the first direction and the third direction.

13. The electronic device according to claim 12, wherein the first direction differs from the third direction by 180 degrees on a Cartesian coordinate system.

14. The electronic device according to claim 1, wherein the first direction differs from the third direction by 180 degrees on a Cartesian coordinate system.

15. The electronic device according to claim 1, wherein the first direction is defined as a negative-y direction on a Cartesian coordinate system and the first array antenna is configured to perform scanning by shifting the first beam within a pre-defined angular range of the negative-y direction in a first xy-plane.

16. The electronic device according to claim 15, wherein the pre-defined angular range of the negative-y direction is +60 degrees to −60 degrees relative to the negative-y direction.

17. The electronic device according to claim 15, wherein the second direction is defined as a positive-x direction on the Cartesian coordinate system and the second array antenna is configured to perform scanning by shifting the second beam within a pre-defined angular range of the positive-x direction in a second xy-plane.

18. The electronic device according to claim 17, wherein the first xy-plane and the second xy-plane are a same plane.

19. The electronic device according to claim 17, wherein the third direction is defined as a positive-y direction on the Cartesian coordinate system and the third array antenna is configured to perform scanning by shifting the third beam within a pre-defined angular range of the positive-y direction in a third xy-plane.

20. The electronic device according to claim 19, wherein the pre-defined angular range of the negative-y direction is +60 degrees to −60 degrees relative to the negative-y direction, the pre-defined angular range of the positive-x direction is +60 degrees to −60 degrees relative to the positive-x direction, and the pre-defined angular range of the positive-y direction is +60 degrees to −60 degrees relative to the positive-y direction.

* * * * *